(12) United States Patent
Masleid et al.

(10) Patent No.: US 8,674,739 B2
(45) Date of Patent: Mar. 18, 2014

(54) SINGLE-INVERSION PULSE FLOP

(75) Inventors: Robert P. Masleid, Monte Sereno, CA (US); Anand Dixit, Mountain View, CA (US)

(73) Assignee: Oracle International Corporation, Redwood Shores, CA (US)

( * ) Notice: Subject to any disclaimer, the term of this patent is extended or adjusted under 35 U.S.C. 154(b) by 126 days.

(21) Appl. No.: 13/030,245

(22) Filed: Feb. 18, 2011

(65) Prior Publication Data

US 2012/0212269 A1 Aug. 23, 2012

(51) Int. Cl.
*H03K 3/356* (2006.01)

(52) U.S. Cl.
USPC .............................. 327/211; 327/200; 327/202

(58) Field of Classification Search
USPC .......................................... 327/211, 200, 201
See application file for complete search history.

(56) References Cited

U.S. PATENT DOCUMENTS

| | | | |
|---|---|---|---|
| 5,015,875 A | 5/1991 | Giles et al. | |
| 5,257,223 A * | 10/1993 | Dervisoglu | 365/154 |
| 5,444,404 A | 8/1995 | Ebzery | |
| 5,552,738 A * | 9/1996 | Ko | 327/203 |
| 5,982,211 A * | 11/1999 | Ko | 327/202 |
| 6,181,179 B1 | 1/2001 | Kanba | |
| 6,240,536 B1 | 5/2001 | Mikan, Jr. et al. | |
| 6,246,265 B1 * | 6/2001 | Ogawa | 326/95 |
| 6,348,825 B1 | 2/2002 | Galbi et al. | |
| 6,404,254 B2 * | 6/2002 | Iwaki et al. | 327/214 |
| 6,433,603 B1 | 8/2002 | Singh et al. | |
| 6,501,315 B1 * | 12/2002 | Nguyen | 327/217 |
| 6,853,212 B2 | 2/2005 | Chandar et al. | |
| 7,058,868 B2 | 6/2006 | Guettaf | |
| 7,596,732 B2 | 9/2009 | Branch et al. | |
| 8,067,970 B2 * | 11/2011 | Masleid | 327/211 |
| 2003/0107421 A1 * | 6/2003 | Markovic et al. | 327/211 |
| 2004/0032290 A1 * | 2/2004 | Lundberg | 327/202 |
| 2004/0090256 A1 * | 5/2004 | Cho | 327/202 |
| 2005/0280459 A1 * | 12/2005 | Inoue | 327/203 |
| 2007/0247197 A1 * | 10/2007 | Masleid | 326/104 |

OTHER PUBLICATIONS

Yano, S., Unified Scan Design with Scannable Memory Arrays, published in: Proceeding ATS '95 Proceedings of the 4th Asian Test Symposium, IEEE Computer Society, Washington, DC, USA, 1995, http://portal.acm.org/citation.cfm?id=783668&dl+GUIDE &coll=GUIDE&CFID=108173823&CFTOKEN=27601895.
MacDonald, et al., Delay Testing of SOI Circuits: Challenges With the History Effect, ITC International Test Conference, 1999, pp. 269-275, http://users.ece.utexas.edu/~touba/research/itc99b.pdf.

* cited by examiner

*Primary Examiner* — Ryan Jager
(74) *Attorney, Agent, or Firm* — Kraguljac Law Group, LLC

(57) ABSTRACT

A single inversion pulse flop includes a critical evaluation path with a single inverter and a storage feedback loop arranged in parallel with the critical evaluation path. The single inversion pulse flop incurs a single inversion delay and does not require an output buffer.

9 Claims, 3 Drawing Sheets

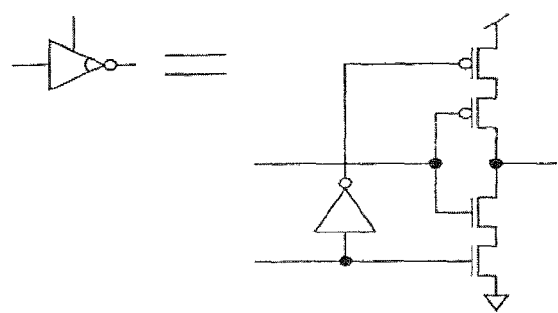
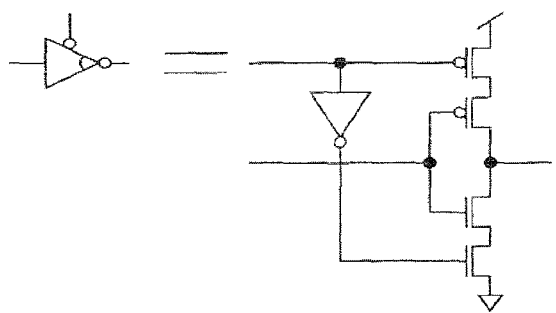
Figure 2A                               Figure 2B

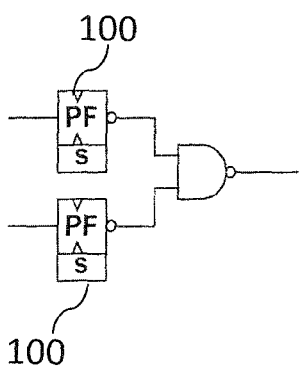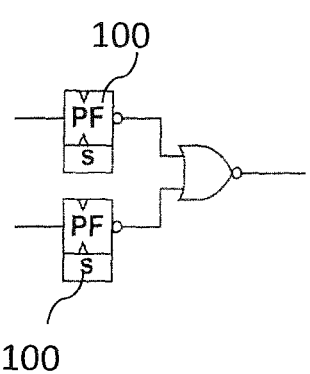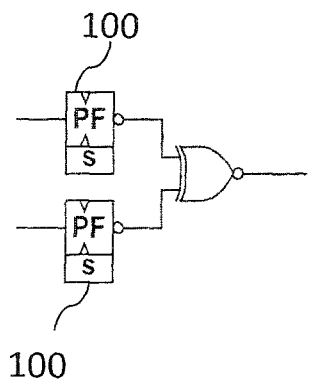
Figure 3A  Figure 3B  Figure 3C

SINGLE-INVERSION PULSE FLOP

BACKGROUND

The operating frequency of processors and other digital integrated circuits has continued to increase, reaching the Gigahertz range in recent years. As the frequency has increased, the delay attributable to the clocked state elements used to store state at the clock cycle boundaries has grown to a larger percentage of the clock cycle time. Accordingly, the amount of time available to do "useful work" has decreased.

The term "flop" is used to refer to one type of clocked state element. A flop is typically an edge-triggered clocked storage device. That is, the flop captures a value responsive to a clock edge (e.g. the rising or falling edge), and stores the value in steady state until the next edge causes a new value to be captured. In complex circuits, many flops may be present in a single logical path, introducing delay and often necessitating output buffers in between flops and logical stages.

BRIEF DESCRIPTION OF THE DRAWINGS

The accompanying drawings, which are incorporated in and constitute a part of the specification, illustrate various systems, methods, and other embodiments of the disclosure. It will be appreciated that the illustrated element boundaries (e.g., boxes, groups of boxes, or other shapes) in the figures represent one embodiment of the boundaries. One of ordinary skill in the art will appreciate that in some embodiments one element may be designed as multiple elements or that multiple elements may be designed as one element. In some embodiments, an element shown as an internal component of another element may be implemented as an external component and vice versa. Furthermore, elements may not be drawn to scale.

FIGS. 2A and 2B are circuit diagrams illustrating one embodiment of a tri-state inverter.

FIGS. 3A-C are circuit diagrams illustrating the pulse flop of FIG. 1 connected to subsequent logic stages.

DETAILED DESCRIPTION

Figure 1:
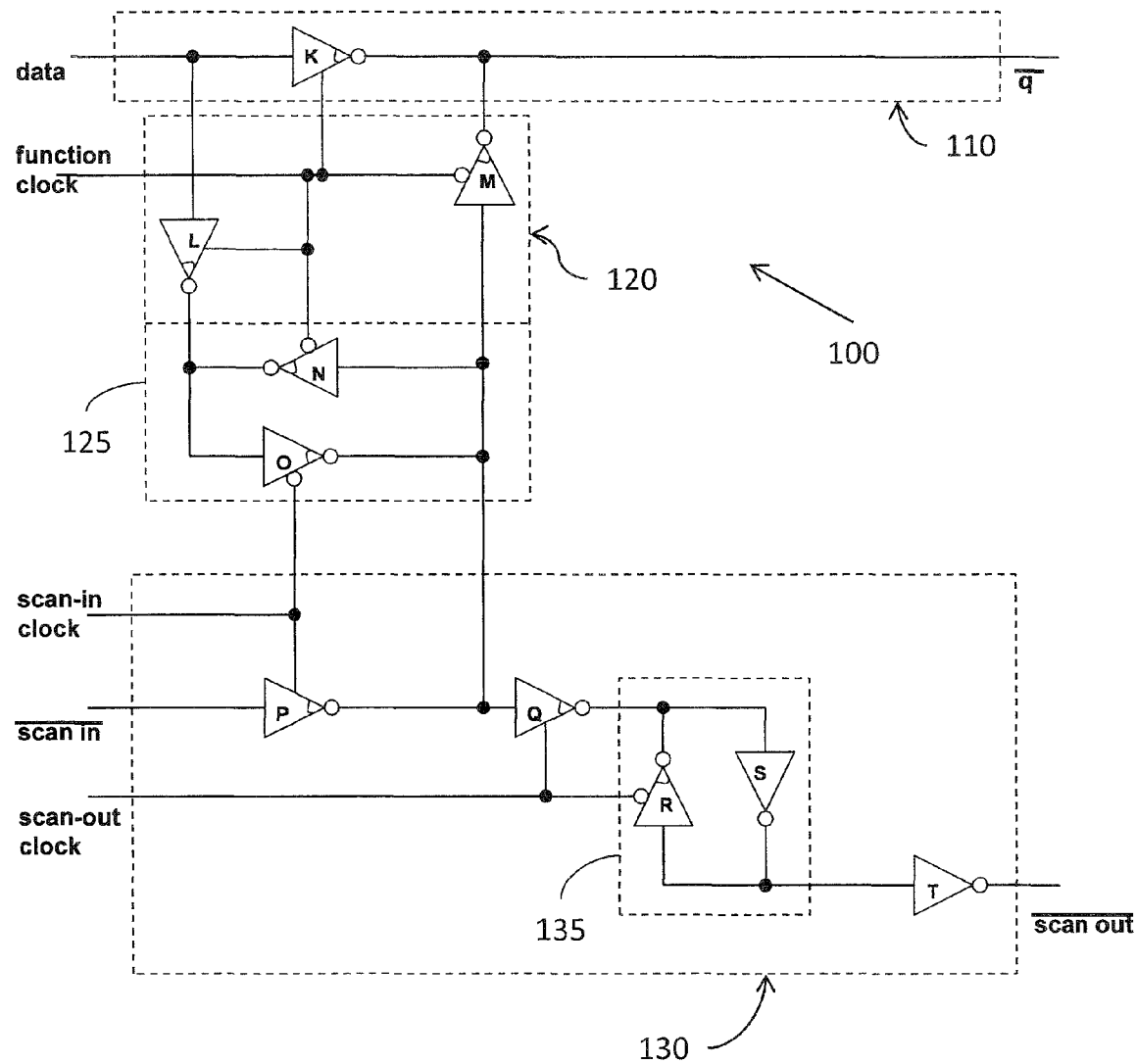
FIG. 1 is a circuit diagram illustrating one embodiment of a pulse flop.

The integrated circuit devices described herein provide a single inversion state element, a "pulse flop", with only one inversion delay between the data input and the state output. This is achieved by placing the storage feedback loop in parallel with the critical evaluation path. With a level clock, the state element serves as a latch. With a pulse clock, the element serves as a flip flop. The pulse flop described herein is well suited for use in lightly loaded critical paths with complex logic, such as compressor trees. In addition, the pulse flop supports scan testing.

The pulse flop does not require an output buffer, giving the designer less delay for cases where little gain is needed. The pulse flop allows standard cell library logic to replace the output buffer without expanding the state element portion of the library. This is especially advantageous because state elements are typically the most expensive digital library cells to build and characterize. This gives the benefit of state elements with built-in logic without having to expand the library to create them.

FIG. 1 is a schematic circuit diagram of one example embodiment of an integrated circuit device that includes a pulse flop 100 and a scan circuit 130. The pulse flop 100 inputs a data bit and outputs the opposite of the data bit, q "bar". The pulse flop 100 functions according to a function clock signal. The function of the pulse flop 100 is to output the opposite of the input while the clock pulse is high and after the pulse to hold the output constant for the duration of the clock signal until a subsequent clock pulse is received.

The pulse flop 100 includes a critical path 110 and a storage feedback loop 120. The critical path 110 includes a single tri-state inverter K that inverts the input data bit. (FIGS. 2A and 2B are circuit diagrams for MOSFET embodiments of the tri-state inverters of the circuit in FIG. 1) The tri-state inverter K is controlled by a functional portion of the clock signal. In the described embodiment, the functional portion of the clock signal is that portion of the clock signal that has a "high" voltage. When the clock signal is high, the tri-state inverter K outputs the opposite of the input data bit as the output of the pulse flop 100. When the clock pulse is "low", the tri-state inverter K is non-enabled and behaves like an open circuit. For the purposes of this description, the various devices (e.g., tri-state inverters) are controlled by particular portions of the clock signal. In other embodiments, the various devices may be controlled by other portions of the clock signal.

The storage feedback loop 120 includes a latch element 125 that stores and holds an input bit value during a non-functional portion of the clock cycle. As can be seen in FIG. 1, the storage feedback loop 120 is arranged in parallel to the critical path 110. A tri-state inverter L outputs an opposite of the input data bit when the clock signal is high. The output of the tri-state inverter L is input to the latch element 125 where it is stored. The latch element 125 includes a tri-state inverter N that is in a non-enabled state during the high clock signal and a tri-state inverter O that is always enabled unless the scan-in clock goes high, which will only occur during scan testing of the circuit. The output of tri-state inverter L is inverted by tri-state inverter O and the non-inverted value of the input data bit will be present at an input to a tri-state inverter M and the latch tri-state inverter N when the clock signal is high.

When the clock signal goes low, the tri-state inverter K is non-enabled and the storage feedback loop 120 provides the output q bar as follows. The tri-state inverter L that provides the input to the latch element 125 is non-enabled when the clock signal is low while the tri-state inverters N and M are enabled. The non-inverted value of the data bit that was present at the input to the tri-state inverters N and M during the high clock signal is inverted and output by the tri-state inverters N and M when the clock signal is low. Thus, the opposite of the input data bit is output by the tri-state inverter M when the clock signal is low. The latch 125 holds the non-inverted value of the input data bit on the input to the tri-state inverter M by cycling the data through the tri-state inverters N and O.

The output of the pulse flop 100 is the output of the tri-state inverter K when the clock is high. When the clock is low, the output of the pulse flop is the output of the tri-state inverter M. The tri-state inverter M protects the latch element 125 from influence due to noise on the output of the pulse flop. This means that no additional inverters or buffers are necessary for the pulse flop 100 and the pulse flop incurs only a single inversion delay. FIGS. 3A-C illustrate the pulse flop 100 connected directly to a NAND stage, a NOR stage and a XNOR stage, respectively, without an intervening buffer.

The pulse flop 100 supports a scan test circuit 130. Scan testing is a standard operation performed on production integrated circuits. In scan testing, a test bit is input to the functional circuit (e.g., pulse flop 100) by way of a separately clocked scan circuit and an output of the scan circuit corresponds to an output of the functional circuit. Thus, the functionality of the circuit can be tested using known bits and a clock signal that can be controlled as desired.

The scan circuit 130 includes two independent clock signals, the scan-in clock and the scan-out clock. During scan testing, the function clock will be held low so that neither tri-state inverter K or L will be enabled and the pulse flop will not be producing an output based on an input data bit. The scan-in clock is pulsed high so that the tri-state inverter P inputs an inversion of the scan-in "bar" bit (corresponding to the non-inverted data bit input to the pulse flop) to the tri-state inverters M, N and Q. In the particular embodiment illustrated in FIG. 1, to check the functionality of the pulse flop, an opposite of the input data bit is used.

When the scan-in clock is low, the latch 125 stores the inverted scan-in bar bit and this stored bit becomes the input to the tri-state inverters Q and M. The scan-out clock is then pulsed high to so that the tri-state inverter Q inputs the stored bit into a latch element 135 (including tri-state inverters R and S) that stores the bit until the next scan out clock pulse. The output of the latch is input to an inverter T that provides the output of the scan circuit. The scan circuit 130 is typically connected in a chain fashion to scan circuits associated with adjacent stages of the integrated circuit device.

FIGS. 3A-C illustrate the pulse flop 100 connected directly to a logical stage. FIG. 3A illustrates the pulse flop 100 connected directly to a NAND stage. FIG. 3B illustrates the pulse flop 100 connected directly to a NOR stage. FIG. 3C illustrates the pulse flop 100 connected directly to an XNOR stage.

References to "one embodiment", "an embodiment", "one example", "an example", and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

While example systems, methods, and so on have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and so on described herein. Therefore, the disclosure is not limited to the specific details, the representative apparatus, and illustrative examples shown and described. Thus, this application is intended to embrace alterations, modifications, and variations that fall within the scope of the appended claims.

To the extent that the term "includes" or "including" is employed in the detailed description or the claims, it is intended to be inclusive in a manner similar to the term "comprising" as that term is interpreted when employed as a transitional word in a claim.

To the extent that the term "or" is used in the detailed description or claims (e.g., A or B) it is intended to mean "A or B or both". When the applicants intend to indicate "only A or B but not both" then the phrase "only A or B but not both" will be used. Thus, use of the term "or" herein is the inclusive, and not the exclusive use. See, Bryan A. Garner, A Dictionary of Modern Legal Usage 624 (2d. Ed. 1995).

To the extent that the phrase "one or more of, A, B, and C" is used herein, (e.g., a data store configured to store one or more of, A, B, and C) it is intended to convey the set of possibilities A, B, C, AB, AC, BC, and/or ABC (e.g., the data store may store only A, only B, only C, A&B, A&C, B&C, and/or A&B&C). It is not intended to require one of A, one of B, and one of C. When the applicants intend to indicate "at least one of A, at least one of B, and at least one of C", then the phrasing "at least one of A, at least one of B, and at least one of C" will be used.

What is claimed is:

1. An integrated circuit device comprising:
    a critical evaluation path that inverts a data input and outputs a corresponding state output during a first clock state of a clock signal, wherein the critical evaluation path includes no more than a single inverter; and
    a storage feedback loop connected in parallel with the critical evaluation path, wherein the storage feedback loop comprises a latch element that latches the data input;
    wherein the storage feedback loop comprises a latch element connected in parallel to the critical evaluation path by way of two tri-state inverters, wherein one of the tri-state inverters is enabled by the first clock state and the other tri-state inverter is enabled by the opposite clock state; and
    further wherein the latch element comprises first and second inverter elements connected in a loop, the first inverter being a tri-state inverter enabled by the opposite clock state and having an output coupled to an input of the second inverter, the output of the second inverter being an input to the first inverter and an output of the latch element.

2. The integrated circuit device of claim 1, wherein the single inverter is enabled by the first clock state.

3. The integrated circuit device of claim 1, wherein the state output is connected directly to a logic stage, without an intervening output inverter.

4. The integrated circuit device of claim 1, wherein the state output is not an input to the storage feedback loop.

5. An integrated circuit device comprising:
    a critical evaluation path comprising a first tri-state inverter, an input of the first tri-state inverter comprising an input to the integrated circuit device and an output of the first tri-state inverter comprising a state output of the integrated circuit device, the first tri-state inverter being enabled by a first clock state;
    a storage feedback loop connected in parallel with the critical evaluation path, the storage feedback loop comprising:
        a second tri-state inverter, an input of the second tri-state inverter comprising the input to the integrated circuit device and the output of the second tri-state inverter being coupled to an input of a latch element, the second tri-state inverter being enabled by the first clock state;
        a third tri-state inverter, enabled by an opposite clock state, an input to the third tri-state inverter comprising an output of the latch element and an output of the third tri-state inverter comprising the output of the integrated circuit device; and
        wherein the latch element comprises fourth and fifth inverter elements connected in a loop, the fourth inverter being a tri-state inverter enabled by the opposite clock state and having an output coupled to an input of the fifth inverter, the output of the fifth inverter being an input to the fourth inverter and the output of the latch element.

6. The integrated circuit device of claim 5, wherein the state output is connected directly to a logic stage, without an intervening output inverter.

7. A system, comprising:
- a critical evaluation path comprising no more than a single inverter that inverts a data input and outputs a state output during a first clock state of a system clock;
- a latch element connected in parallel with the critical evaluation path, wherein the latch element is configured to latch the data input;
- wherein the latch element is connected in parallel to the critical evaluation path by way of two tri-state inverters, wherein one of the tri-state inverters is enabled by the first clock state and the other tri-state inverter is enabled by the opposite clock state, the latch element and two tri-state inverters together forming a storage feedback loop; and
- further wherein the latch element comprises first and second inverter elements connected in a loop, the first inverter being a tri-state inverter enabled by the opposite clock state and having an output coupled to an input of the second inverter, the output of the second inverter being an input to the first inverter and an output of the latch element.

8. The system of claim 7, wherein the single inverter is enabled by the first clock state.

9. The system of claim 7, wherein the state output of the system is connected directly to a logic stage, without an intervening output inverter.

* * * * *